United States Patent [19]

Yu et al.

[11] Patent Number: 6,057,218
[45] Date of Patent: May 2, 2000

[54] METHOD FOR SIMULTANEOUSLY MANUFACTURING POLY GATE AND POLYCIDE GATE

[75] Inventors: Jiunn-Liang Yu, Taipei; Chih-Cherng Liao, Hsinchu; Chen-Jen Kuo, Tainan, all of Taiwan

[73] Assignee: Vanguard International Semiconductor Corporation, Hsinchu, Taiwan

[21] Appl. No.: 09/307,404

[22] Filed: May 7, 1999

[51] Int. Cl.[7] ............................................ H01L 21/28
[52] U.S. Cl. .................. 438/592; 438/584; 438/585; 438/614; 438/622; 438/628
[58] Field of Search ........................ 438/584, 585, 438/592, 614, 622, 628

[56] References Cited

U.S. PATENT DOCUMENTS 5,604,157   2/1997   Dai et al. ............................. 437/200

*Primary Examiner*—Charles Bowers
*Assistant Examiner*—Lisa Kilday
*Attorney, Agent, or Firm*—Wood, Herron & Evans, L.L.P.

[57] ABSTRACT

The present invention discloses a method for simultaneously manufacturing a poly gate and a polycide gate which requires only one gate oxide layer deposition and one polysilicon layer deposition steps by incorporating a protective layer, primarily an oxide layer, which acts as a mask of a silicide. The present invention not only simplifies the process but also avoids a residual spacer in the gate. The advantages also includes widening the process window, controlling the gate channel and avoiding the gate top loss.

14 Claims, 4 Drawing Sheets

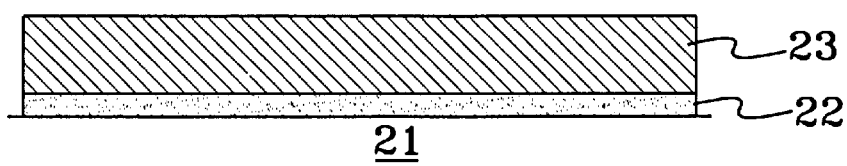
FIG. 2a
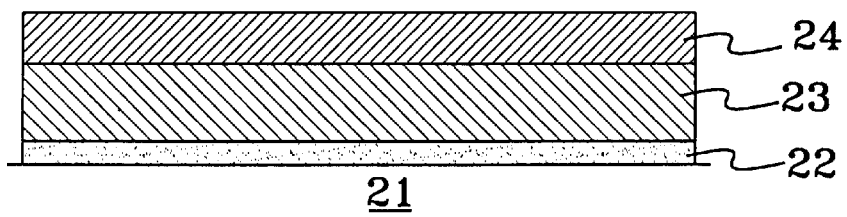
FIG. 2b
FIG. 2c
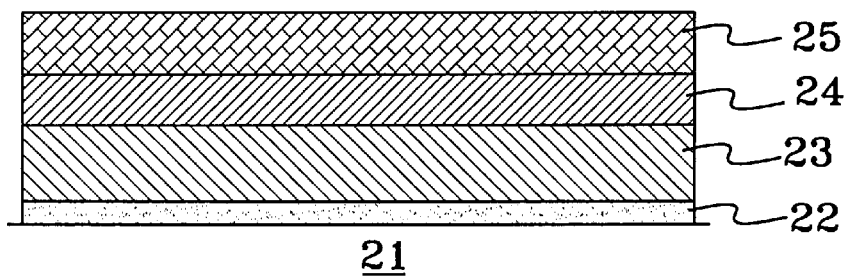
FIG. 2d

METHOD FOR SIMULTANEOUSLY MANUFACTURING POLY GATE AND POLYCIDE GATE

BACKGROUND OF THE INVENTION

1. Field of the Invention

The present invention relates to a method for manufacturing a poly gate and a polycide gate, more particularly, to a method for simultaneously manufacturing and integrating a poly gate and a polycide gate of an integrated circuit onto a chip.

2. Description of the Related Art

With the technological advances in the electronic industry, the trend of electronic products moves toward integrating peripheral devices onto a chip. They originally needed a printed circuit board on which memory module chips are mounted and peripheral circuits are added. But now, with the upgrading in the design ability of electronic devices and in the processability of semiconductors, the memory and the peripheral devices are gradually being integrated onto a chip. Thus it brings the manufacturers of electronic products and consumers a more convenient and versatile choice, further stimulating and accelerating the advance of the electronic industry. For the semiconductor chip manufacturers, this trend of advance implies the challenge and promotion of technical ability.

Using an image chip as an example, in order to enhance the performance and resolution of images, each image must be resolved into more than one million pixels and then each pixel is memorized into a memory cell of a memory chip. At this time, the performance of the image chip expresses itself in two manners. Firstly, whether the memory cells on each pixel array can truly store potential signals representative of pixels. If the stored electronic signals fail to truly record pixels due to leakage, transmitted images are incorrect. A common phenomenon is that many spots appear on an image due to the leakage of storage signals of memory cells, resulting in a poor image. Secondly, the access speed of memory cells in the peripheral circuits integrated in the image chip must be fast enough to process large volumes of data in the pixel arrays.

Accordingly, memory cells on a chip must meet two requirements, one of which is that the current representing electronic signals can not be leaked, but the speed requirement is relatively not so high; the other is that a fast speed is required, and leakage is not the key point of requirement so long as it is within a certain limit.

Metal-oxide-semiconductor field-effect transistor (MOSFET) is the most important device in ultra large scale integrated circuits, whose structure includes a metal-oxide-semiconductor (MOS) capacitor with both the source and the drain positioned at both sides of the MOS capacitor and having electricity opposite to the silicon substrate, wherein the MOS capacitor comprises an uppermost metal portion known as a gate, an oxide layer beneath the gate, and a lowermost semiconductor, commonly a silicon substrate.

The uppermost metal portion of the MOS capacitor primarily comprises of polysilicon known as a poly gate. Sometimes there is a need for depositing a layer of silicide over the polysilicon since the resistivity of a polysilicon is not the lowest. The gate comprising polysilicon and silicide is referred to as a polycide gate.

The poly gate and the polycide gate individually meet the requirements above for leakage and access speed. The resistivity of the poly gate is not the lowest and the access speed thereof not the fastest, whereas its leakage is less serious. So that the poly gate is suitable as a component of the pixel array area where requires storing potential signals without leakage in an image chip. On the other hand, in contrast to the poly gate, the polycide gate is more likely to produce leakage. The polycide gate is suitable as a peripheral circuit of the image chip to meet the requirement of fast speed in favor of quickly processing large volumes of pixel data within the pixel array area because of its low resistivity, small RC time delay and fast device switching speed.

However, in order for simultaneously manufacturing the poly gate and the polycide gate on the silicon substrate, many derived process problems are left behind to be solved. These are the subject which the present invention intends to solve.

A process for simultaneously manufacturing a poly gate and a polycide gate integrated onto a chip of the prior art is shown from FIG. 1a to FIG. 1d. A poly gate is first produced in a poly gate region 1, including depositing a gate oxide layer 3 of an MOS capacitor, depositing a polysilicon 4 and through photolithographic and etching processes. The deposition layer on a polycide gate region 2 is etched cleanly to retain the original state, as shown in FIG. 1a. Subsequently a polycide gate is produced, including depositing a gate oxide layer 5, a polysilicon 6 and finally a silicide layer 7, and patterning a polycide gate photoresist 8 by the photolithographic process, as shown in FIG. 1b. After which the deposition layer other than covered by the polycide gate photoresist is removed to form a polycide gate 10, as shown in FIG. 1c. Finally, a gate spacer is prepared, as shown in FIG. 1d.

This is a straightforward method. In other words, since two different gates are required, one of which is first made and next the other one. The gate oxide layer and the polysilicon required are deposited twice. Problems derived therefrom include: firstly, the gate oxide layer must be deposited twice and etched twice; secondly, the polysilicon must also be deposited twice and etching is also carried out twice. It further induces the most serious third and fourth problems besides adding process burden, which are: thirdly, the second deposition of the polysilicon forms residues on the poly gate due to etching problems, resulting in a residual spacer 9, as shown in FIG. 1c; fourthly, the residual spacer makes the channel of the poly gate not easily controllable and also causes the poly gate spacer 11 not identical to the polycide gate spacer 12, as shown in FIG. 1d. Fifthly, the process window needs fine adjustment which may take more than one month. Not only this consumes time but also laborious. Sixthly, it causes top lost of the poly gate upon etching the second deposited polysilicon.

Briefly, the prior art first produces a poly gate and then a polycide gate. The first made poly gate suffers various problems caused by the course of producing the polycide gate, including deposition residual, overetching etc.

SUMMARY OF THE INVENTION

An object of the invention is to provide a novel and practical method for simultaneously manufacturing a poly gate and a polycide gate, particularly on the same chip, to meet different requirements for memory cells.

Another object of the invention is to provide a novel and practical method for manufacturing a poly gate and a polycide gate that can reduce the deposition times of a gate oxide layer, reduce process steps and simplify the process.

Still another object of the invention is to provide a novel and practical method for manufacturing a poly gate and a polycide gate that can reduce the deposition times of polysilicon, reduce process steps and simplify the process.

A further object of the invention is to provide a novel and practical method for manufacturing a poly gate and a polycide gate that can avoid both the residual polysilicon and the residual spacer.

Another further object of the invention is to provide a novel and practical method for manufacturing a poly gate and a polycide gate that can effectively control the gate channel.

Still further object of the invention is to provide a novel and practical method for manufacturing a poly gate and a polycide gate that can broaden the process window in favor of control while saving time and labor.

Still yet another object of the invention is to provide a novel and practical method for manufacturing a poly gate and a polycide gate that can avoid the gate top loss.

To achieve abovementioned objects, the present invention discloses a method for simultaneously manufacturing a poly gate and a polycide gate which requires only one gate oxide layer deposition and one polysilicon layer deposition steps by incorporating a protective layer, primarily an oxide layer, which acts as a hard mask of a silicide.

BRIEF DESCRIPTION OF THE DRAWINGS

FIG. 2a depicts a step of forming a gate oxide layer on a silicon wafer substrate of the invention.

FIG. 2b depicts a step of depositing a polysilicon layer of the invention.

FIG. 2c depicts a step of depositing a silicide layer of the invention.

FIG. 2d depicts a step of depositing a protective layer of the invention.

DETAILED DESCRIPTION OF THE INVENTION

To solve problems of the prior art and to achieve the abovementioned objects, the present invention discloses a method for simultaneously manufacturing a poly gate and a polycide gate on an integrated circuit chip comprising the steps of preparing a gate oxide layer, depositing a polysilicon layer on the gate oxide layer, depositing a silicide layer, preparing a protective layer, patterning a polycide gate photoresist in a region whereto a polycide gate is going to produce, removing the protective layer not covered by the polycide gate photoresist, removing the silicide layer not covered by the polycide gate photoresist, patterning a poly gate photoresist in a region whereto a poly gate is going to produce, removing the polysilicon layer not covered by the poly gate photoresist and the protective layer and removing the photoresist to form the poly gate and the polycide gate. The term "simultaneously" herein means that two gates are made at the same time on the same substrate, especially a silicon wafer substrate. Whereby a poly gate and a polycide gate are prepared on the same chip to meet various requirements.

The following will further describe in detail an embodiment carried out by the method according to the invention.

Figure 1A:
FIG. 1a depicts steps of producing a poly gate of the prior art.
Figure 1B:
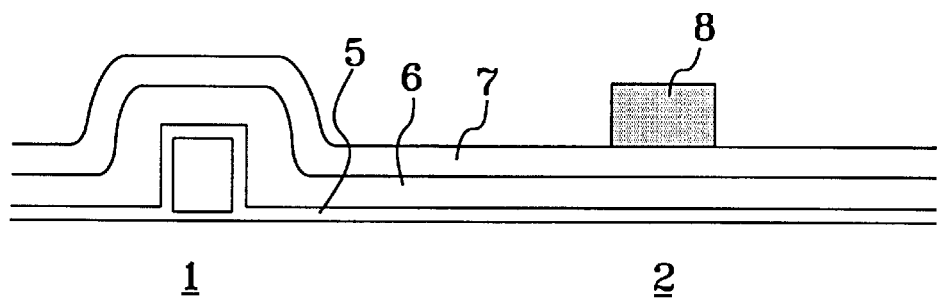
FIG. 1b depicts steps of subsequently producing a polycide gate of the prior art.
Figure 1C:
FIG. 1c depicts a step of removing deposition layer other than covered by a patterned photoresist of the polycide gate of the prior art.
Figure 1D:
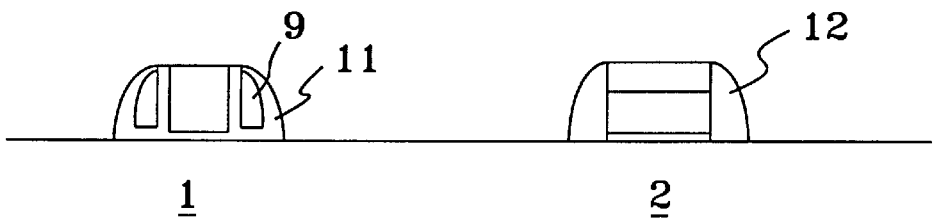
FIG. 1d depicts a step of preparing a gate spacer of the prior art.
Figure 2E:
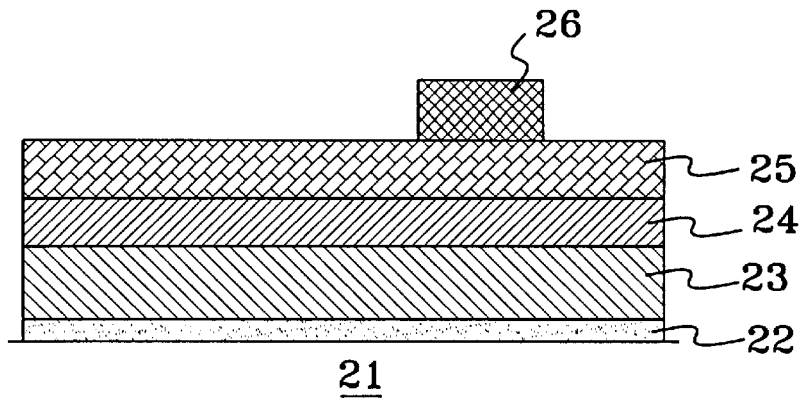
FIG. 2e depicts a step of patterning a photoresist in the polycide gate region of the invention.

Refer to FIGS. 2a –2k. An active area is prepared on a silicon wafer substrate by a well known method. A gate oxide layer 22 is then formed on the silicon wafer substrate 21 wherein the thickness of the gate oxide layer is from 50 to 300 Å, as shown in FIG. 2a. The gate oxide layer 22 may be of same thickness or with varying thicknesses. The gate oxide layer of same thickness will maintain the threshold voltage, Vt, and breakdown voltage of each MOS device to be constant. Under certain circumstances, such as that peripheral circuits needed to accelerate the access speed of signals and that memory arrays require the reliability of stored signals, these entail the gate oxide layer accomplished by varying thickness. That is to say, the gate oxide layer therein may be of single thickness or with varying thicknesses at different regions such as a dual gate oxide layer.

A polysilicon layer 23 is deposited on the gate oxide layer 22 as shown in FIG. 2b, wherein the thickness of the polysilicon layer is from 1500 to 3500 Å. The polysilicon layer 23 is the component of the poly gate and polycide gate in the MOS device of the invention.

After finishing the deposition of the polysilicon layer, a silicide layer 24 is then deposited in order to further produce a polycide gate, as shown in FIG. 2c, wherein the thickness of the silicide layer is from 500 to 2000 Å. The resistivity of the silicide layer is lower than that of the polysilicon and which can effectively form a low resistivity ohmic contact between the polysilicon and a metal conductor. The subsequently formed polycide gate reduces RC delay time, enhances the executing speed of devices and accelerates the access speed of signals. The compositional metal elements of the silicide layer are titanium, molybdenum, tantalum, or tungsten (Ti, Mo, Ta, or W), and a more common silicide layer is tungsten silicide ($WSi_x$). The thermal expansion coefficient thereof is closest to that of silicon, the stress is lower, there is a stronger covalent bonding and the ability of resistant to electron migration is better than that of other silicides —even if it is not the material that has the lowest resistivity.

A protective layer 25 is then deposited on the silicide layer as shown in FIG. 2d, wherein the protective layer is an oxide layer whose thickness is from 500 to 3500 Å. The protective layer is used as a hard mask for the protection of the polycide gate upon subsequent etching poly gate processes.

After depositing layers described above, all Layers required to produce the poly gate and polycide gate are completed. Next, it is necessary to carry out the patterning of the two gates, repectively.

A polycide gate photoresist is patterned on the polycide gate region by use of a photomask through photolithographic and etching processes, as shown in FIG. 2e. The polycide gate photoresist 26 defines the polycide gate and is used as a mask for subsequent etching. The so called "gate photoresist" refers to a photoresist patterned from a gate photomask after the photoresist has been coated, exposed, developed and etched and defines the gate pattern on the region whereto the gate is formed.

Figure 2F:
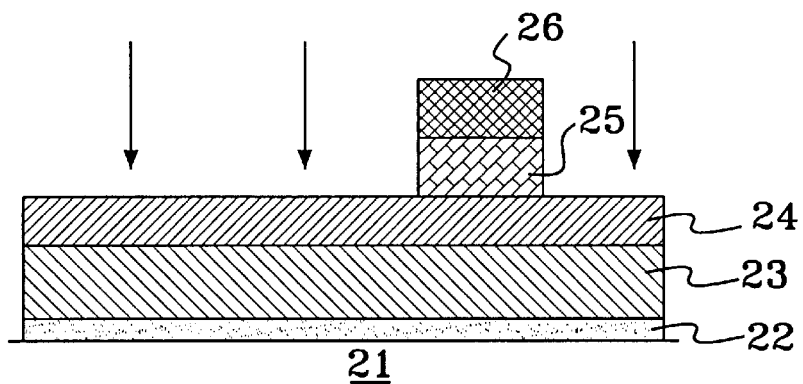
FIG. 2f depicts a step of the invention for removing the protective layer where is not protected by the photoresist.

The protective layer 25 not covered by the polycide gate photoresist 26 is removed by further etching, as shown in FIG. 2f.

Figure 2G:
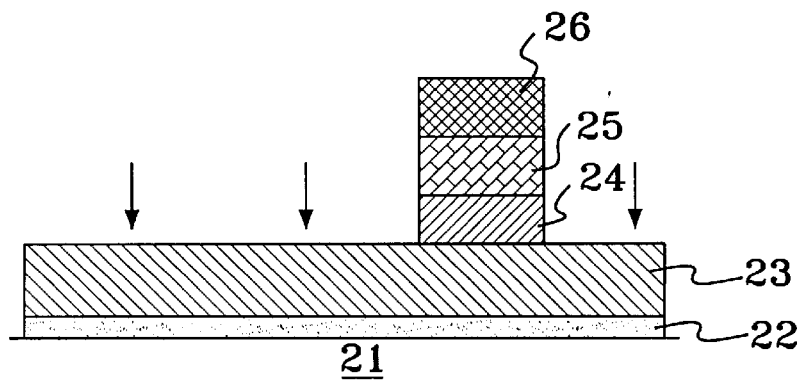
FIG. 2g depicts a step of the invention for removing the silicide layer where is not protected by the photoresist.
Figure 2H:
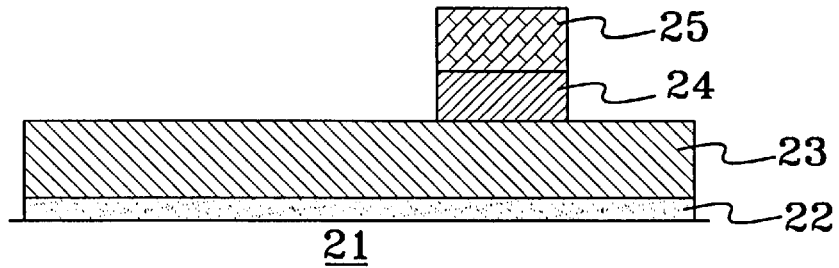
FIG. 2h depicts a step of removing the photoresist of the invention.

The silicide layer 24 not covered by the polycide gate photoresist 26 is then removed by yet further etching, as shown in FIG. 2g. After which, the polycide gate photoresist 26 is removed, as shown in FIG. 2h. The removal of the silicide layer 24 can be carried out before or after removing the polycide gate photoresist 26. That is say, after removing the silicide layer not covered by the polycide gate photoresist, a step of removing the polycide gate photoresist is further comprised or before removing the silicide layer not covered by the polycide gate photoresist a step of removing the polycide gate photoresist is further comprised. The patterned protective layer 25 is used as a hard mask for the protection from etching of the silicide layer 24 on the polycide gate pattern.

Figure 2I:
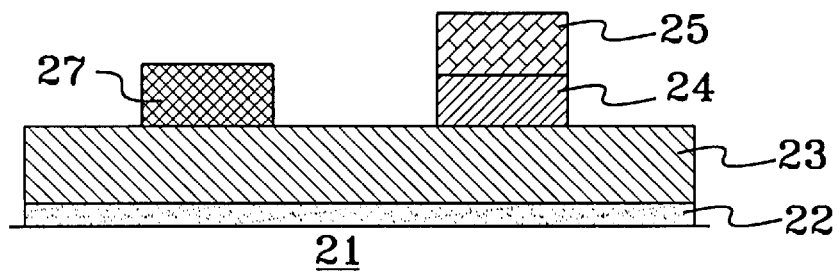
FIG. 2i depicts a step of patterning a photoresist in the poly gate region of the invention.

After the patterning of the polycide gate, the poly gate is patterned by use of a photomask through photolithographic and etching processes to form a photoresist pattern on the poly gate region, as shown in FIG. 2i. The poly gate photoresist 27 defines the poly gate and is used as a mask for subsequent etching.

Figure 2J:
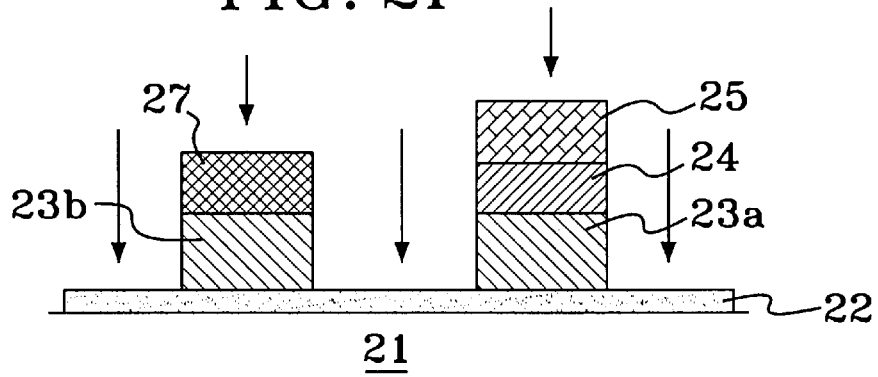
FIG. 2j depicts a step of removing a portion of the polysilicon layer of the invention.

A portion of the polysilicon layer 23 is removed by further etching, as shown in FIG. 2j. The poly gate and the polycide gate are masked by the poly gate photoresist 27 and the protective layer 25, respectively. After etching of the polysilicon, the polycide gate polysilicon layer 23a and the poly gate polysilicon layer 23b retained are the poly components of the polycide gate and the poly gate, respectively.

Figure 2K:
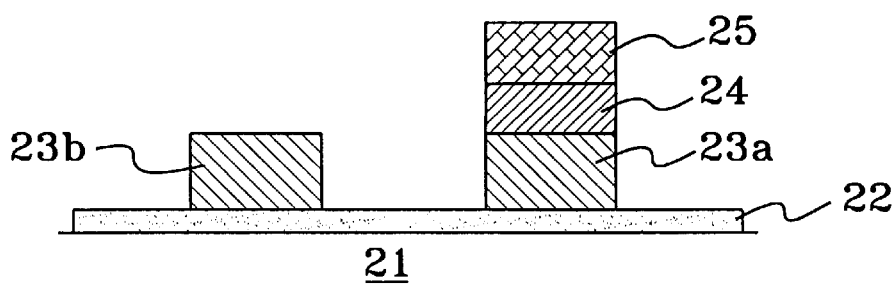
FIG. 2k depicts a step of removing the photoresist and completing the poly gate and polycide gate of the invention.

Finally, the photoresist is removed to complete the poly gate and the polycide gate, as shown in FIG. 2k. Steps of preparing a poly gate spacer and a polycide gate spacer are further comprised after forming the poly gate and the polycide gate, as shown in FIG. 2k. The poly gate and the polycide gate of the invention, due to the absence of a residual polysilicon spacer caused by the second deposition of the polysilicon according to the prior art, not only do not have problems that channels are not easily controllable and that the process window is too small, but also do not cause any gate top loss.

The detailed description stated above is only the preferred embodiment of the invention and not intended to limit the protective scope of the invention thereby. All other modifications and changes without departing from the spirit of the invention should be defined by the following claims.

What is claimed:

1. A method for simultaneously manufacturing a poly gate and a polycide gate on an integrated circuit chip, comprising the steps of:
   preparing a gate oxide layer;
   depositing a polysilicon layer on the gate oxide layer;
   depositing a silicide layer;
   preparing a protective layer;
   patterning a polycide gate photoresist in a region whereto the polycide gate is going to produce;
   removing the protective layer not covered by the polycide gate photoresist;
   removing the silicide layer not covered by the polycide gate photoresist;
   patterning a poly gate photoresist in a region whereto the poly gate is going to produce;
   removing the polysilicon layer not covered by the poly gate photoresist and the protective layer; and
   removing the poly gate photoresist to form the poly gate and the polycide gate.

2. The method of claim 1, wherein the gate oxide layer is of single thickness, or with varying thicknesses at different regions.

3. The method of claim 1, wherein the metal elements of the silicide layer are titanium, molybdenum, tantalum, or tungsten.

4. The method of claim 1, wherein the silicide layer comprises tungsten silicide.

5. The method of claim 1 or 2, wherein the thickness of the gate oxide layer is from 50 to 300 Å.

6. The method of claim 1, wherein the thickness of the polysilicon is from 1500 to 3500 Å.

7. The method of claim 1, wherein the thickness of the silicide layer is from 500 to 2000 Å.

8. The method of claim 1, wherein the thickness of the protective layer is from 500 to 3500 Å.

9. The method of claim 1, wherein the protective layer is an oxide layer.

10. The method of claim 1, which further comprises steps of preparing a poly gate spacer and a polycide gate spacer after forming the poly gate and the polycide gate.

11. The method of claim 1, which further comprises a step of removing the polycide gate photoresist before removing the silicide layer not covered by the polycide gate photoresist.

12. The method of claim 1, which further comprises a step of removing the polycide gate photoresist after removing the silicide layer not covered by the polycide gate photoresist.

13. The method of claim 2, wherein the thickness of the gate oxide layer is from 50 to 300 Å.

14. The method of claim 8, wherein the protective layer is an oxide layer.

* * * * *

UNITED STATES PATENT AND TRADEMARK OFFICE
CERTIFICATE OF CORRECTION

PATENT NO. : 6,057,218
DATED : May 2, 2000
INVENTOR(S) : Jiunn-Liang Yu et al.

Page 1 of 1

It is certified that error appears in the above-identified patent and that said Letters Patent is hereby corrected as shown below:

Column 6,
Line 30, change "1 or 2" to -- 1 --

Signed and Sealed this

Twenty-eighth Day of August, 2001

*Attest:*

NICHOLAS P. GODICI
*Attesting Officer*   *Acting Director of the United States Patent and Trademark Office*